US006845165B1

(12) United States Patent
Motohashi et al.

(10) Patent No.: US 6,845,165 B1
(45) Date of Patent: Jan. 18, 2005

(54) ACOUSTIC EFFECT APPARATUS AND METHOD AND PROGRAM RECORDED MEDIUM THEREFOR

(75) Inventors: Haruhiko Motohashi, Tokyo (JP); Yasuhiko Mori, Toride (JP); Mikio Nagashima, Hachiouji (JP)

(73) Assignee: Korg Incorporated (JP)

( * ) Notice: Subject to any disclaimer, the term of this patent is extended or adjusted under 35 U.S.C. 154(b) by 0 days.

(21) Appl. No.: 09/601,515

(22) PCT Filed: Dec. 21, 1999

(86) PCT No.: PCT/JP99/07180

§ 371 (c)(1),
(2), (4) Date: Aug. 2, 2000

(87) PCT Pub. No.: WO00/39786

PCT Pub. Date: Jul. 6, 2000

(30) Foreign Application Priority Data

Dec. 24, 1998 (JP) .......................................... 10/366374

(51) Int. Cl.[7] ................................................ H03G 5/00
(52) U.S. Cl. ............................ 381/98; 381/61; 381/62; 381/101; 381/118
(58) Field of Search .............................. 381/98, 61, 62, 381/101, 118; 84/622, 692, 659; 333/287

(56) References Cited

U.S. PATENT DOCUMENTS

| | | | | |
|---|---|---|---|---|
| 3,683,417 A | * | 8/1972 | Gummel | 716/1 |
| 4,135,590 A | * | 1/1979 | Gaulder | 381/94.3 |
| 4,797,933 A | * | 1/1989 | Hahne | 381/96 |
| 4,909,116 A | * | 3/1990 | Tanaka et al. | 84/692 |
| 5,040,220 A | * | 8/1991 | Iwamatsu | 381/63 |
| 5,668,885 A | * | 9/1997 | Oda | 381/98 |
| 5,850,460 A | * | 12/1998 | Tanaka et al. | 381/186 |
| 6,111,960 A | * | 8/2000 | Aarts et al. | 381/61 |
| 6,285,767 B1 | * | 9/2001 | Klayman | 381/17 |
| 6,504,935 B1 | * | 1/2003 | Jackson | 381/61 |

FOREIGN PATENT DOCUMENTS

| | | |
|---|---|---|
| JP | 51-48036 | 1/1974 |
| JP | 51-121238 | 10/1975 |
| JP | 58-190698 | 12/1983 |
| JP | 1-186008 | 7/1989 |
| JP | 6-295178 | 10/1994 |
| JP | 08-076753 | 3/1996 |
| JP | 09-330082 | 6/1996 |

* cited by examiner

*Primary Examiner*—Xu Mei
*Assistant Examiner*—Justin Michalski
(74) *Attorney, Agent, or Firm*—Connolly, Bove, Lodge & Hutz, LLP

(57) ABSTRACT

A high pass filter 32 having a cut-off frequency of 200 Hz and a cut-off response of +12 dB/OCT and a low pass filter 33 having a cut-off frequency of 400 Hz and a cut-off response steeper than −24 dB/OCT are used to pick out components in a double overtone region of 200~400 Hz of a bass musical instrument such as a base or a bass drum from an input audio signal. The component which is picked out is input to distortion applying means 34 having an input-output response which is a non-linear response having no point symmetry with respect to 0 point, thus applying a distortion to cause even-numbered overtone components to be produced. An output from the distortion applying means 34 and the input audio signal are summed in a summer 18 to be delivered. Natural tones which have boosted bass tones and which are free from impurity are obtained.

11 Claims, 13 Drawing Sheets

PRIOR ART

PRIOR ART

PRIOR ART

ACOUSTIC EFFECT APPARATUS AND METHOD AND PROGRAM RECORDED MEDIUM THEREFOR

TECHNICAL FIELD

The invention relates to an apparatus and a method for imparting an acoustical effect by boosting a bass region of an audio signal such as a musical tone signal, and a program recorded medium used therefor.

BACKGROUND ART

Some people desire to enjoy a physical sensation of a music in addition to listening to the music through the ear. A physical sensation of the music may be obtained by boosting bass tones to a higher loudness level. In the conventional practice of boosting bass tones, an equalizer is used to boost the bass region of an audio signal, and the boosted audio signal is amplified by a high capacity output amplifier, an amplified output signal of which is used to drive a gigantic woofer (loudspeaker used devotedly for the bass region). However, this approach fails to yield the intended effect unless the boosting of the bass tones takes place to a great extent. If it is attempted to achieve a similar effect with a low capacity output amplifier and a small size loudspeaker, there results a distortion of sounds.

It is recognized that auditory sensation of a man is susceptible to a tendency that he feels bass tones boosted when listening to harmonics containing a lot of overtones of bass components. There is a proposal that exploits this tendency to achieve an apparent boosting of bass tones by feeding bass components of an input audio signal to a nonlinear circuit to produce overtones of bass components in the input audio signal, which are then added to the input audio signal.

To give an example, Japanese Laid-Open Patent Application No. 328,481/1993 proposes a technique illustrated in FIG. 1. Specifically, stereophonic left-channel and right-channel signals from input terminals 11L and 11R are passed through low pass filters 12L and 12R, respectively, having a cut-off frequency of 100 Hz to pick out bass components equal to or less than 100 Hz, which are then subject to full wave rectification in a full wave rectifier circuit 13. An output signal from the full wave rectifier 13 is then passed through a bandpass filter 14 having a pass band of 100–200 Hz. In other words, double overtone signals of bass components produced by the full wave rectifier circuit 13 may be obtained from the bandpass filter 14 and added to the left-channel and right-channel signals from the input terminals 11L and 11R to be delivered to output terminals 15L and 15R.

The prior art shown in FIG. 1 picks out bass components through the low pass filters 12L, 12R. These low pass filters 12L, 12R have a cut-off frequency of 100 Hz, and have an increased time constant, which causes the output signal from the bandpass filter 14 to be synthesized in a considerably lagging relationship with respect to the input signals from the input terminals 11L, 11R. This means that signals in the input audio signal which represent vocals and tones from alto or middle frequency range musical instruments such as tenor saxophone as well as tones from high pitch or frequency range musical instruments such as a violin and a flute would be displaced in time with respect to signals representing tones from bass instruments such as a base and a bass drum, presenting a strange sensation for a concurrent rendition of these musical instruments.

Also proposed in Japanese Laid-Open Patent Application No. 186,008/1989 is a technique illustrated in FIG. 2. An input audio signal from an input terminal 11 is fed to a low pass filter 12 having a cut-off frequency on the order of 100 Hz, and bass components from the low pass filter 12 are amplified by a power amplifier 16 before being input to a nonlinear circuit 17. The nonlinear circuit 17 comprises two diodes in anti-parallel connection which clip the positive and the negative side of the input signal amplitude, whereby the input signal waveform is distorted, producing harmonics components of the input signal or overtone signals. The overtones thus produced are added to the input audio signal from the input terminal 11 in a summer 18 to be delivered to an output terminal 15.

Again in this prior art, the low pass filter having a cut-off frequency on the order of 100 Hz is used, and thus them remains the problem of time misalignment between bass components and higher pitch components in the similar manner as occurs with the technique shown in FIG. 1. Furthermore, if a bass tone containing a component having a fundamental frequency of 110 Hz is concurrently input with a bass drum tone containing a component having a fundamental frequency of 100 Hz, the nonlinear circuit 17 would produce components representing both sum and difference between the both input signals, or 10 Hz component and 210 Hz component, resulting in boosting unwanted bass tones and producing sounds which are unmusical and granting.

In addition, proposed in Japanese Laid-Open Patent Application No. 295,178/1994 is a technique illustrated in FIG. 3. The technique is employed in a sound source unit for an electronic musical instrument. Accordingly, musical tone waveform data from an input terminal 1 comprises sinusoidal wave data having a fundamental frequency such as a sound produced by the oscillation of a single string, for example, and sinusoidal wave data for overtone frequencies thereof, and thus is not data which represent waveforms of musical tones from a plurality of musical instruments. This musical tone waveform data is delayed by one clock period (a sampling period of the musical tone waveform data) in an interruption circuit 21*a* in a differential circuit 21. The delayed data is subtracted from non-delayed data in a subtractor 21 *b*, and a result of subtraction is delivered as a differential data to be input to a non-linear conversion table 22 where the differential data is subject to a non-linear conversion by the non-linear conversion table 22. The converted data is summed with multiplication output data from a multiplier 23*a* in an additive circuit 23. A result of summation is delivered as musical tone data having added bass tones to an output terminal 15. The output musical tone data is also delayed by one clock period by a delay circuit 23*c* to be input to the multiplier 23*a*, which multiplies the input data by a diversion preventive coefficient a.

In this manner, higher pitch components are boosted in the differential circuit 21 so that the non-linear conversion by the non-linear conversion table 22 allows musical tones, which are overtones based on the higher pitch components, to be produced, while bass components are boosted in the additive circuit 23, with the distortion of overtones and the like which are based on the higher pitch components being boosted to a greater degree than the distortion of overtones and the like which are based on the bass components while allowing the bass components to be also boosted. Descriptions are given that the differential circuit 21 exhibits a response similar to a high pass filter with respect to input waveform data, that bass components similar to waveform data which is input appear in the additive circuit 23, and that a musical tone waveform signal is obtained which includes a distortion of overtones and the like resulting from the higher pitch components.

In this prior art, as many as six versions of input-output response of the non-linear function which the non-linear conversion table 22 yields are indicated in FIG. 5 of the above cited Application. These responses have a point symmetry as illustrated in FIG. 4 with respect to an input reference point, namely, a point of intersection $P_0$ between an input axis and an output axis, as illustrated. As a consequence, overtones which are produced as a result of the non-linear conversion by the non-linear conversion table 22 include more of odd-numbered harmonics (overtones) than even-numbered harmonics (overtones), and it is noted that such a musical tone having an abundance of odd-numbered overtones disadvantageously leads to an indistinct and vacant timbre. As described, the higher pitch components of the input musical tone data is boosted in the differential circuit 21 before it is fed to the non-linear conversion table 22. In other words, all of higher pitch components in the input musical tone data are boosted before being fed to the non-linear conversion table 22. Hence, where the input data comprises an output signal from a CD (compact disc) player or a rendition output signal from an electronic musical instrument, not only musical tone data from a bass musical instrument such as a base or a bass drum, but data for tones from a variety of musical instruments such as data for vocals and tones from alto musical instrument such as saxophone as well as data for musical tones from alto and higher pitch musical instruments such as violin, flute and the like are also included; or more specifically, what is input to the table 22 has an abundance of data representing musical tones having components equal to or higher than 400 Hz. Accordingly, data for musical tones in the alto and higher pitch range, which are unnecessary for boosting musical tone data for bass tones, are also boosted and subjected to the non-linear conversion by the non-linear conversion table 22, causing higher pitch data to be produced which are distorted in an unnecessary manner. This, in addition to degrading the boosting of bass tones in a relative sense, results in a cross modulation when the plurality of varieties of alto and higher pitch musical tone data are input to the non-linear conversion table, producing components corresponding to differences and sums of frequencies among the plurality of alto and higher pitch musical tone data, that is, components which are not originally contained in the musical tone signal, and thus disadvantageously producing acoustic abnormalities in the auditory sensation.

It is an object of the present invention to provide an apparatus and a method for acoustic effect which is capable of producing overtones of fundamental tones of bass musical instruments such as a base, a bass drum and the like and boosting bass tones while maintaining a time concurrency between bass components and alto and/or higher pitch components so as to yield brilliant and clearly intonated sounds.

It is another object of the invention to provide an apparatus and a method for acoustic effect which is capable of producing overtones of fundamental tones of bass musical instruments such as a bass, a bass drum and the like and boosting bass tones while maintaining a time concurrency between bass components and alto and/or higher pitch components without producing components which are not originally present in the musical tone signal to cause acoustic abnormalities in the auditory sensation.

It is to be understood that what is generically referred to herein as a bass musical instrument is one which produces a fundamental tone equal to or below 200 Hz. Accordingly, while it is possible to produce a fundamental tone of 300 Hz with the bass, the latter is not included in the bass musical instrument when it is used to produce a fundamental tone of such a higher pitch.

DISCLOSURE OF THE INVENTION

In one form of the invention, components corresponding to double or higher overtones of a bass musical instrument such as a bass, a bass drum or the like are picked out from an input audio signal by filter means, and distortion applying means applies a non-linear distortion which is unsymmetrical with respect to the center of an amplitude to the components which correspond to double or higher overtones.

In another form of the invention, components corresponding to double overtone regions of a bass musical instrument such as a bass or a bass drum are picked out from an input audio signal by filter means, and distortion applying means applies a non-linear distortion to the double overtone region components which arm picked out.

In either form, it is preferred to pick out components corresponding to fundamental tones of each bass instrument while reducing a level thereof also.

In either form, it is preferred that higher pitch components be removed from an output signal from the distortion applying means by means of a low pass filter means.

BEST MODES FOR CARRYING OUT THE INVENTION

Figure 5:
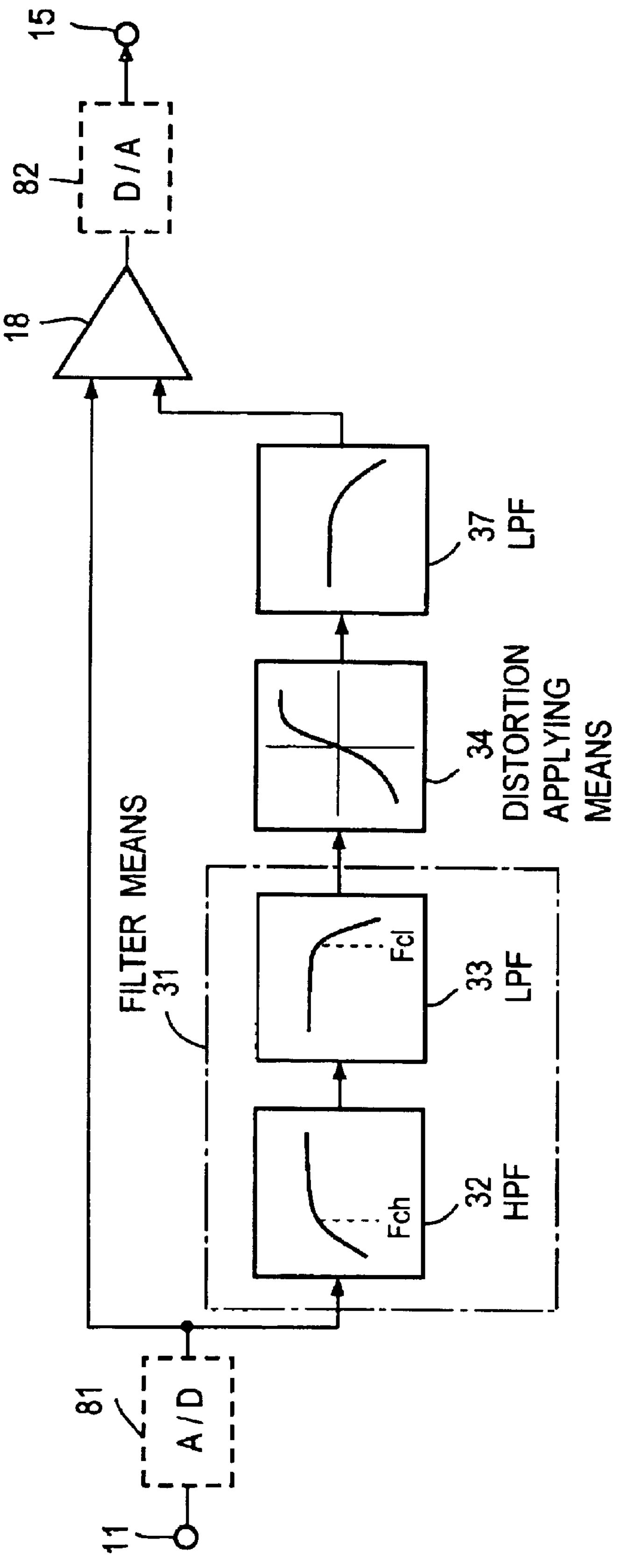
FIG. 5 is a block diagram showing an embodiment of the invention.

FIG. 5 shows an embodiment of the invention. An audio signal such as an output signal from a CD (compact disc) player (which may be a digital output signal), a rendition output signal from an electronic musical instrument, a rendition output signal from an electrical musical instrument, an output signal from a microphone which receives the sound of a music being played in an auditorium, a digital signal which is decoded from musical data transmitted by an electronic distribution is input to an input terminal 11.

Filter means 31 picks out the signals corresponding to double or higher overtones of a bass musical instrument such as a bass or a bass drum from the input audio signal from the input terminal 11. In the present instance, the filter means 31 only comprises a high pass filter (HPF) 32. The high pass filter 32 has a cut-off frequency Fch which depends on the variety of a musical instrument, for which the bass tones are to be boosted, and which lie in a range of 50~300 Hz, but which may be on the order of 200 Hz so as to be generally applicable to any bass musical instrument. The high pass filter 32 has a cut-off response which is chosen so that components corresponding to fundamental tones of the bass musical instrument are reduced in their levels, but can not be completely cut off so as to be delivered from the high pass filter 32. The cut-off response may be preferably on the order of 12 dB/OCT, for example. Specifically, assuming that a bass tone to be boosted has fundamental tone of 100 Hz while the high pass filter 32 has a cut-off frequency of 200 Hz, the fundamental component of 100 Hz appears in the output signal from the high pass filter 32 with a level reduction by a factor of 4.

This embodiment is designed so as to pick out components corresponding to double overtone regions of a bass musical instrument from the input audio signal by means of the filter means 31, and a low pass filter (LPF) 33 is connected in series with the high pass filter 32. The cut-off frequency Fch of the high pass filter 32 and the cut-off frequency Fcl (Fcl>Fch) of the low pass filter 33 are chosen so that a band between the cut-off frequencies Fch and Fcl substantially coincides with the double overtone regions of the bass musical instrument. The cut-off frequency Fcl depends on the variety of a musical instrument for which the bass tones are to be boosted, and is chosen in a range of 200~450 Hz. However, when Fcl equal to or higher than 450 Hz is chosen, when a no-linear distortion is applied to components which are picked out by the filter means 31, a cross modulation causes acoustic abnormalities to be produced resulting in boosting undesirable, relatively higher pitch tones and thus losing the bass tone boosting effect. To be suitable to any bass musical instrument, it is preferable that the cut-off frequency Fcl be on the order of 400 Hz. In order to prevent such acoustic abnormalities from occurring, it is desirable that the low pass filter 33 has a steep cut-off response, which should be at least equal to −12 dB/OCT, preferably −24 dB/OCT or even steeper.

When picking out components corresponding to double overtone regions, it is preferred for the filter means 31 to be adequate to any bass musical instrument that it has a cut-off frequency Fch on the order of 200 Hz and a cut-off response on the order of +12 dB/OCT on the bass side and a cut-off frequency Fcl on the order of 400 Hz and a cut-off response of −24 dB/OCT or a steeper bandpass response on the higher pitch side.

Figure 6:
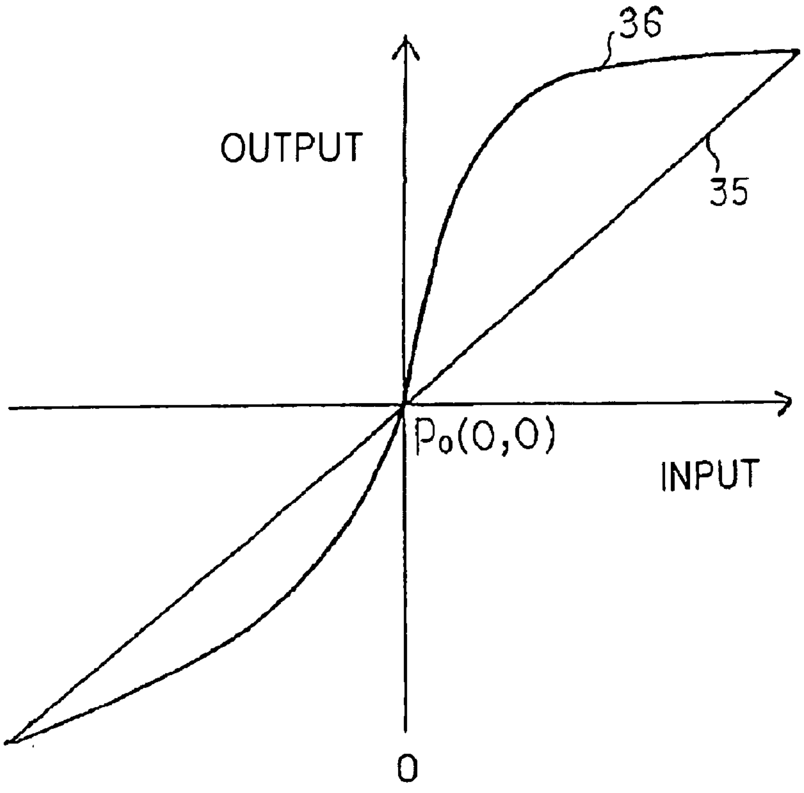
FIG. 6 diagrammatically illustrates an example of input-output response of distortion applying means 34 shown in FIG. 5.

Components corresponding to double overtone regions of the bass musical instrument contained in the input audio signal which are picked out by the filter means 31 are fed to distortion applying means 34 where a non-linear distortion is applied thereto. The distortion applying means 34 has a non-linear input-output response, and in particular a non-linear response which has no point symmetry with respect to the center of an amplitude of the input signal is desirable. For example, as illustrated in FIG. 6, it is desirable to have an S-shaped curve 36 as contrasted to a rectilinear line 35 and which has a warped configuration so that the S-shape does not exhibit a point symmetry with respect to reference point $P_0$ of the input axis, which is a point of intersection (0,0) between the input axis and the output axis as shown. Preferably, a non-linear characteristic curve 36 is located on the output axis side of the rectilinear line disposed at an angle of 45° with respect to the input axis and passing through the reference point $P_0$, which represents a linear characteristic line providing equal values between an input value and an output value, so that it provides a greater output for a small input, thus exhibiting a gain greater than 1 while the gain is reduced and the output approaches a saturation as the input increases. It should be noted that the reference point $P_0$ is not limited to a point where the input value is 0 and the output value is equal to 0, but considering the application of a bias, the center of an amplitude of the input signal is chosen as the reference point.

The distortion applying means 34 applies a distortion to the input components corresponding to the double overtone regions, thus producing their harmonics (overtones). The distorted components corresponding to the double overtone regions may be fed to a low pass filter (LPF) 37 as required to remove unnecessary higher pitch components which may be harmful to the auditory sensation. Alternatively, a suitable frequency response may be given to the produced harmonics (overtone) components. The low pass filter 37 may have a cut-off frequency on the order of 200 Hz and a cut-off response of −12 dB/OCT.

In this manner, a signal containing overtones which correspond to the components corresponding to the double overtone regions is obtained from the low pass filter 37, and is summed with the input audio signal from the input terminal 11 in a summer 18 to be delivered to an output terminal 15.

The audio signal delivered from the output terminal 15 has an abundance of overtones and thus includes an apparent boosting of bass tones. Specifically, a musical tone signal which is produced as the musical instrument is attacked on and which has a higher level for overtones will be subject to the saturation region of the S-shaped response (FIG. 6) of the distortion applying means 34, whereby they are strongly compressed to produce more overtones, thus boosting a beat sensation and an impact sensation. If the level is slightly reduced subsequent to the attack, the output level does not decline immediately because a corresponding central region of the S-shaped response has a high gain. Thus, overtones of a musical tone signal which eminently represent the power of expression and features of a base or a bass drum used as a musical instrument are more positively pronounced upon attack, and then if the level of the original tone is reduced, the levels of the overtones which the musical tone signal originally contains are raised by the gain which is obtained in the central region of the S-shaped response to boost changes in the timbre of the bass or the bass drum, combined with the production of overtones anew which is achieved by the non-linearity in the central region of the S-shaped response even though such non-linearity is not so remarkable as noted in the saturation region of the S-shaped response. Thus, the features of the S-shaped response are effective, not only upon the attack of the bass or the bass drum, but over the entire musical tones, to extract and boost the abundant music-expressing elements of the bass or the bass drum which are masked and embedded therein, namely, the sense of the bass drum driving the air with sound pressure, delicate expressions upon attack and the slight reverberation of bass tones of the bass, thereby producing new overtones in a more exaggerated manner to yield a sense of impact and a dynamic sense. When the S-shaped response is chosen to avoid the point symmetry (or to produce asymmetry between the positive and the negative side) as shown in FIG. 6, odd-numbered overtones can be diminished while even-numbered overtones can be augmented to allow tones of a more abundance and a less impurity in the musical sense to be obtained.

Furthermore, by picking out components corresponding to double overtone regions by means of the filter means 31, a plurality of varieties of musical tone signals from higher pitch musical instruments which are of a higher pitch than such region can not be input simultaneously into the distortion applying means 34. In other words, the likelihood that overtones of musical tone signals from these higher pitch musical instruments are produced to cause a cross modulation is eliminated, thus eliminating the likelihood that acoustic abnormalities which can not be found in the music and which are grating may be produced. Because a low pass filter having a larger time constant which may be exemplified by a cut-off frequency of 100 Hz is not used, a time concurrency between higher pitch components and the distorted bass and alto components in the input audio signal can be secured in the output signal.

Figure 7:
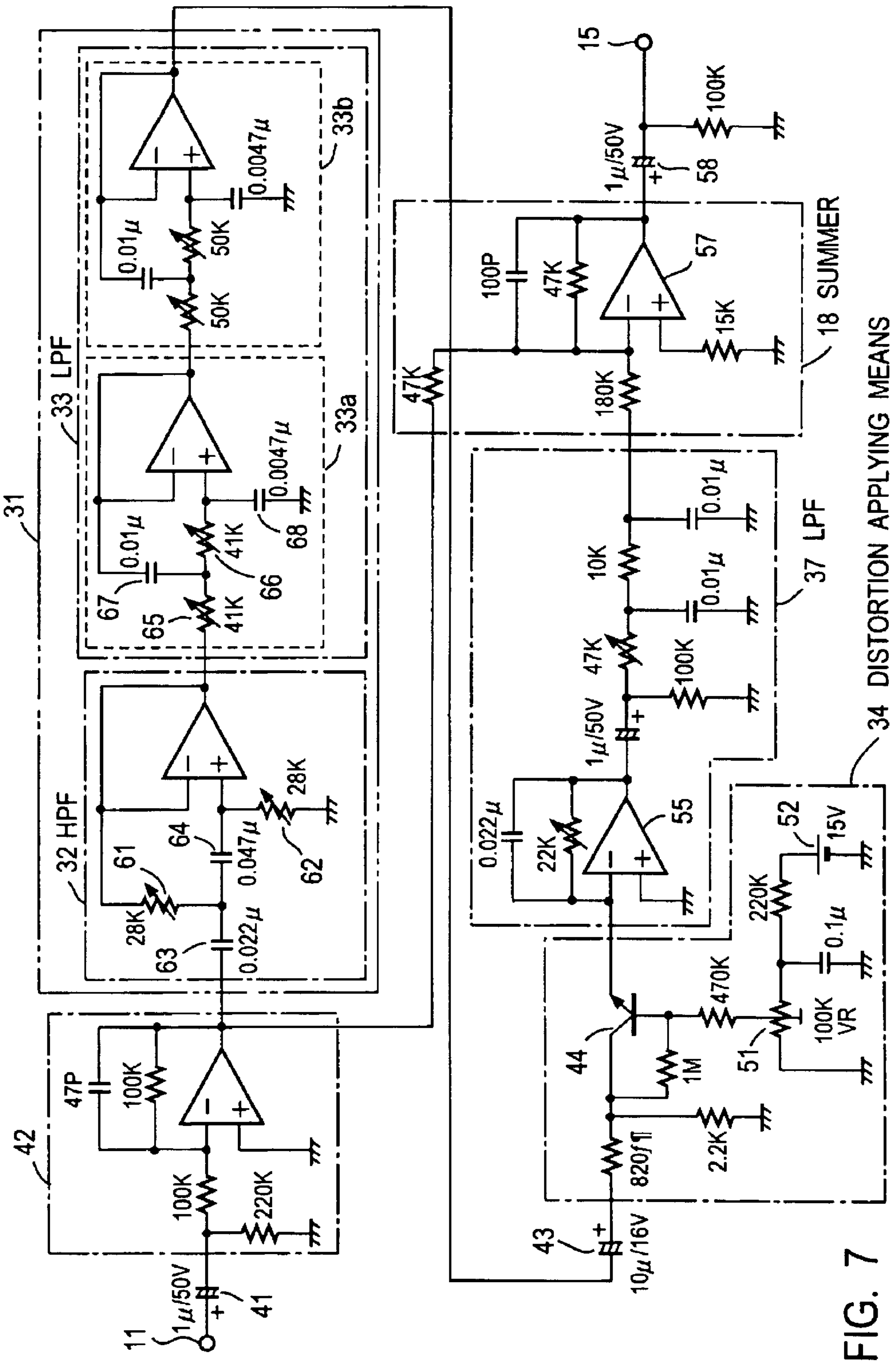
FIG. 7 is a circuit diagram of an example in which the arrangement shown in FIG. 5 is formed with an analog circuit.

A specific example of forming the acoustic effect apparatus shown in FIG. 5 with an analog circuit is shown in FIG. 7. An input audio signal from an input terminal 11 passes through a d.c. cut-off capacitor 41 and thence through a buffer circuit 42 to be fed to a high pass filter 32, which comprises capacitive elements, resistor elements and an operational amplifier to act as a second order active filter. An output signal from the high pass filter 32 is fed to a low pass filter 33, which comprises a series circuit of second order active filters 32*a* and 33*b*, each comprising resistor elements, capacitive elements and an operational amplifier, and which is thus is formed as a fourth order active filter having a steep cut-off response.

Figure 8:
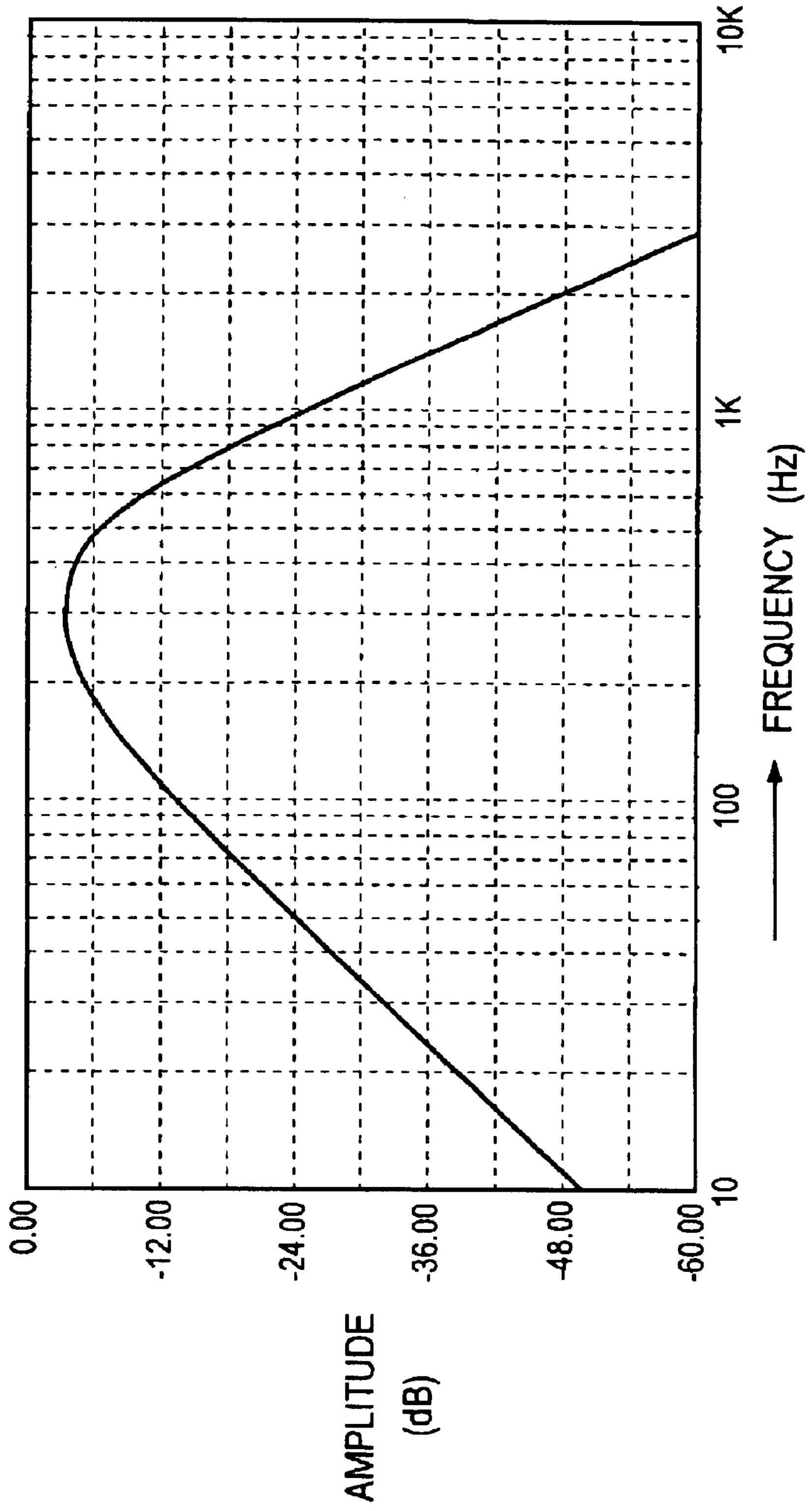
FIG. 8 diagrammatically illustrates an amplitude-frequency response of filter means 31 shown in FIG. 7.

A total amplitude-frequency response of the high pass filter 32 and the low pass filter 33 becomes as shown in FIG. 8. It will be seen from this Figure that the high pass filter 32 has a cut-off frequency of about 200 Hz and a cut-off response substantially equal to 12 dB/OCT while the low pass filter 33 has a cut-off frequency of about 450 Hz and a cut-off response substantially equal to −24 dB/OCT. Thus, the both filters 32 and 33 constitute together a bandpass filter having a pass band of 200 Hz~450 Hz and in which the cut-off on the bass side takes place gently with +12 dB/OCT while the cut-off on the higher pitch side takes place steeply at −24 dB/OCT.

Figure 9:
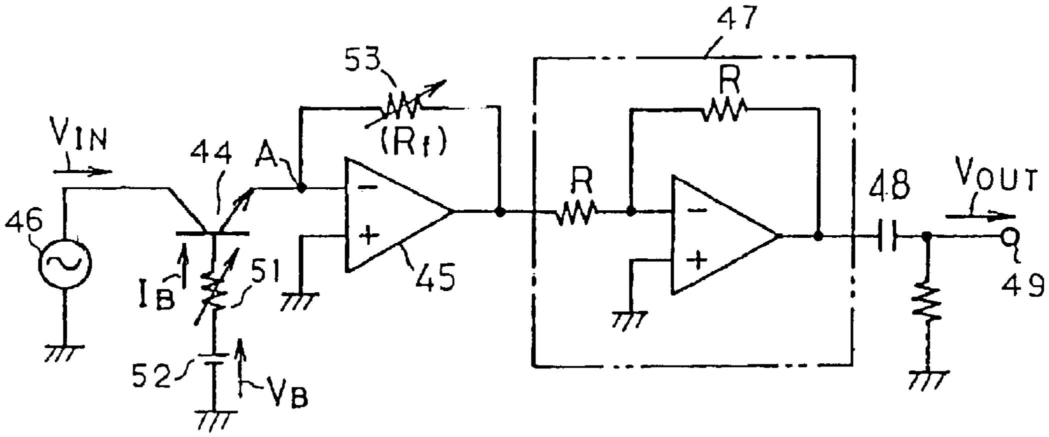
FIG. 9 is a circuit diagram showing a specific example of distortion applying means 34 shown in FIG. 5.

An output signal from the low pass filter 33 is passed through a d.c. cut-off capacitor 43 to distortion applying means 34. The distortion applying means 34 utilizes the non-linearity in a small $V_{CE}$ region of a collector current Ic-collector-emitter voltage $V_{CE}$ response of a transistor 44. The distortion applying means 34 is described, for example, in Japanese Laid Open Patent Application Number 76,753/1996. Briefly describing this, this distortion applying circuit comprises a transistor 44 and an operational amplifier 45 as shown in FIG. 9. In this example, an NPN transistor is used for the transistor 44, with the collector of the transistor 44 connected to a signal source 46, and the emitter of the transistor 44 connected to an input point A of the operational amplifier 45. A buffer amplifier 47 is connected to the output side of the operational amplifier 45, and an output from the buffer amplifier 47 is taken out through a d.c. blocking capacitor 48 to an output terminal 49. A bias voltage $V_B$ of a positive polarity is supplied from a power source 52 to the base of the transistor 44 through a current adjusting resistor 51. The input point A of the operational amplifier 45 represents an inverting input terminal, to which a feedback signal is negatively fed back from the output through a feedback resistor 53.

Figure 10:
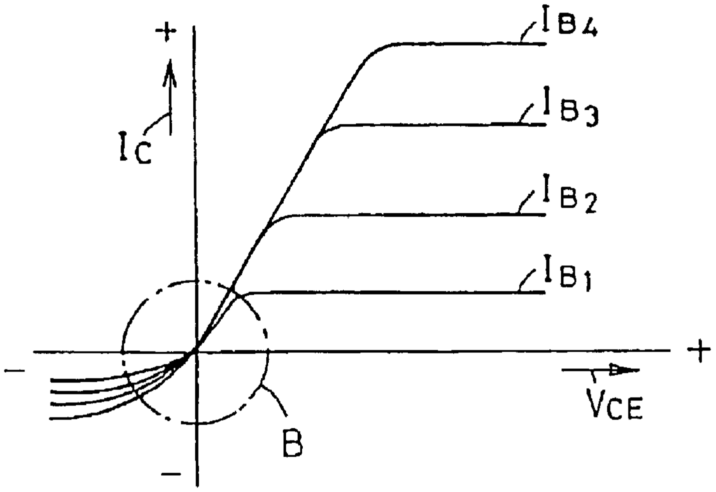
FIG. 10 diagrammatically illustrates a collector current responses of a transistor 44 shown in FIG. 9.

It is assumed that a signal source 46 delivers a signal of minimal amplitude which does not include a direct current voltage. The voltage at the input point A of the operational amplifier 45 is maintained at the same potential as the common potential by the negative feedback operation. As a consequence, the voltage of the signal which is delivered from the signal source 46 is applied alone across the collector-emitter of the transistor 44. Under this condition, the transistor 44 operates in a non-linear region B of the collector current Ic-collector-emitter voltage $V_{CE}$ response in the vicinity of point zero as shown in FIG. 10.

Since the signal delivered from the signal force 46 has a level of a minimal value in the non-linear region B, it follows that the transistor 44 feeds an emitter current (which is substantially equal to a collector current) to the input point A in accordance with the amplitude of the signal applied from the signal source 46 about the zero point of the collector current response.

Figure 11:
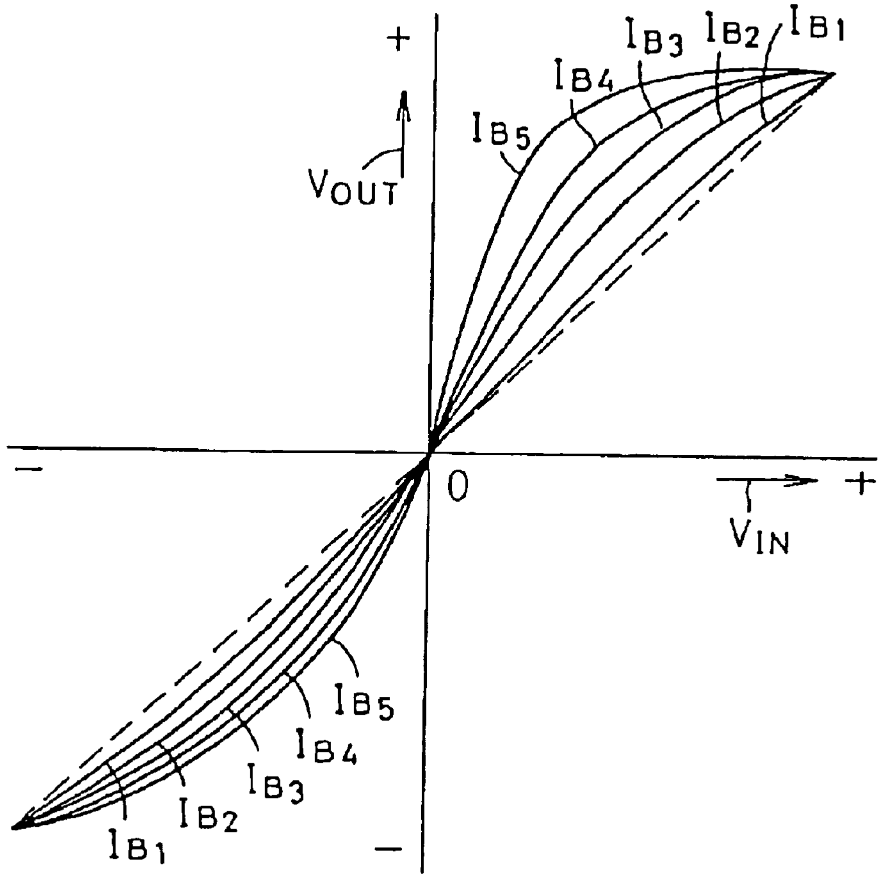
FIG. 11 diagrammatically illustrates an input-output response of a distortion applying circuit shown in FIG. 9.

When the resistance $R_f$ of the feedback resistor 53 is adjusted such that the level $V_{OUT}$ of an input signal delivered to the output signal 49 is equal to the level $V_{IN}$ of the input signal such that $V_{OUT}=V_{IN}$ as the resistance of the current adjusting resistor 51 is adjusted to change the base current $I_B$ from $R_{B1}$ to $I_{B5}$ ($I_{B1}>I_{B2}>I_{B3}>I_{B4}>I_{B5}$), it will be seen that when the base current $I_B$ is sufficiently high as indicated by $I_{B1}$, there results a nearly linear response as indicated in FIG. 11, but as the base current $I_B$ is gradually decreased, the collector current tends to exhibit a constant current response in the positive region, thus enhancing the distortion.

Because the amplification factor Hfe is small in the negative region, a change in the collector current response in the negative region is small. When the response which changes between the positive and the negative region is considered as a non-linear response, it can be said that a negative distortion response is relatively smooth while the distortion in the positive side is sharp, representing a response having an abundance of overtones.

When there is a difference between the positive and the negative response, it is possible to produce many even-numbered overtones. Where the distortion is symmetrical in both the positive and the negative side, it is possible to produce odd-numbered overtones. Accordingly, by adjusting the base current $I_B$, the manner of distortion occurring can be controlled, allowing the distortion to be adjusted to achieve a desired timbre.

Figure 12:
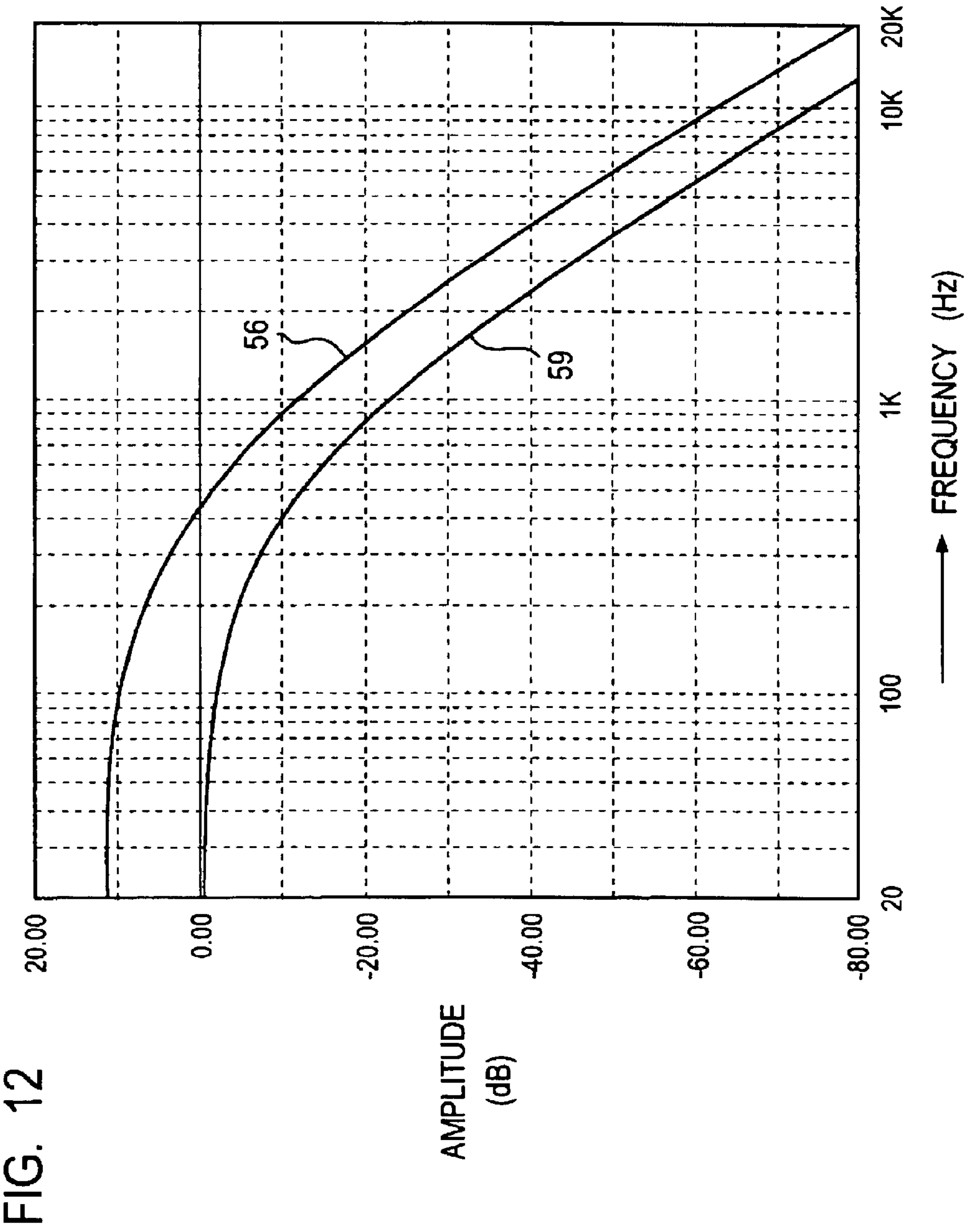
FIG. 12 diagrammatically illustrates an amplitude-frequency response of a low pass filter 37 shown in FIG. 7.

In FIG. 7, a low pass filter 37 comprises an operational amplifier 55, resistor elements and capacitive elements, and the emitter of the transistor 44 in the distortion applying means 34 is connected to an inverting input terminal of the operational amplifier 55 which is arranged on the input side of the filter, and the operational amplifier 55 also serves as an operational amplifier 45 shown in FIG. 9. The amplitude-frequency response of the low pass filter 37 is shown by a curve 56 in FIG. 12. It will be seen from this Figure that the low pass filter 37 has a cut-off frequency of about 200 Hz and a cut-off response substantially equal to −12 dB/OCT. Since frequency components in the harmonic (overtone) components produced by the distortion applying means 34 which are effectively acting in boosting the bass tones are in a range of 200 Hz~1 kHz, it will be seen that this band is located adjacent to the beginning of the attenuation for the higher pitch cut-off in the frequency response, and thus there is provided an arrangement such that components in a range of 200 Hz~1 kHz undergo a greater reduction in their levels as the frequency increases, thus preventing the higher pitch regions in these components from being excessively boosted. In other words, the low pass filter 37 provides a balance between the bass components and the higher pitch components.

An output signal from the low pass filter 37 and an output signal from the buffer circuit 42 are summed together in a summer 18 which comprises an operational amplifier 57, and a summed output signal is delivered to an output terminal 15 through a direct current cut-off capacitor 58. While an input signal to the summer 18 is connected to the inverting input through a resistor in the circuit diagram, it should be understood that it may be connected to the non-inverting input. A capacitor which is connected across the operational amplifier 57 to provide a negative feedback has a capacitance which is as small as 100 pF and is used to eliminate noises, and does not function substantially as a low pass filter. Incidentally, a total amplitude-frequency response of the low pass filter 37 and the summer 18 is shown by a curve 59 in FIG. 12. The operational amplifier 57 also serves as a buffer amplifier 47 shown in FIG. 9. Numerals entered neighboring individual resistor elements in FIG. 7 indicate their resistances while numerals entered neighboring individual capacitors indicate their capacitances.

In the specific example shown in FIG. 7, the filter means 31 provide a level reduction by a factor of 4 for a fundamental tone component of 100 Hz, for example, while no level reduction occurs for components corresponding to its overtones of 200 Hz, 300 Hz and 400 Hz when they are input to the distortion applying means 34, where a distortion is applied to an overtone component of 200 Hz which has a relatively high level, whereby overtone components of 400 Hz, 600 Hz and 800 Hz are produced. It is to be noted that all of these overtone components produced represent even-numbered overtones of the fundamental tone component of 100 Hz, allowing a tone to be obtained which has an abundance and which is free from impurity. In particular, because the filter means 31 interrupts the audio signal which is located on the order of 400 Hz or above, a higher pitch musical tone component can not be input to the distortion applying means 34 if a musical tone signal from a higher pitch musical instrument is input to the input terminal 11, thus avoiding the occurrence of a cross modulation thereof to cause the occurrence of acoustic abnormalities. Assuming that the non-linear response of the distortion applying means 34 has no point symmetry with respect to the center of the input amplitude as indicated in FIG. 6, many even-numbered overtone components of the 200 Hz input overtone component (400 Hz, 800 Hz, 1200 Hz . . . ) are produced while odd-numbered overtone components are reduced, thus providing a tone having an abundance and freedom from impurity for the input 200 Hz overtone.

Even though components having frequencies of 100 Hz and 500 Hz which represent the difference and the sum between the 200 Hz component and the 300 Hz component contained in the input overtone components as well components having frequencies of 100 Hz and 700 Hz which represent the difference and the sum between the 300 Hz overtone component and the 400 Hz overtone component contained in the input overtone components, or odd-numbered overtone components for the fundamental tone component, are also produced by the non-linear response of the distortion applying means 34, it will be seen that the number of these is reduced, and in addition, the overtone components which are input are considerably reduced in their levels as compared with the fundamental tone component which does not undergo a level reduction, and accordingly, the odd-numbered overtone components which are generated have reduced levels, and can not have any significant influence upon the tones in the output audio signal. If musical tone signals from different varieties of bass musical instruments are simultaneously input, the filter means 31 pick out components corresponding to their overtone regions and allow them to be input to the distortion applying means 34. Even though components representing the differences between and the sums of the components corresponding to overtone regions of different varieties of musical instruments, or tone components which are not inherent in the respective musical instruments are produced, there is little influence of them upon the tones in the output audio signal as compared with the components representing the differences between and the sums of the fundamental components of different varieties of musical instruments inasmuch as the components corresponding to the overtone regions have levels which are considerably reduced in comparison to the fundamental components.

The fundamental tone components (100 Hz) which has its level reduced is input to the distortion applying means 34 where its overtones are produced without accompanying the problems of the prior art to any significant degree, thus achieving a boosting of the bass tones which has been intended in the prior art.

When the input audio signal contains a vocal or a musical tone signal from alto and/or bass musical instrument such as a tenor saxophone, such signal can not cause many overtone components to be produced because of its reduced level if the signal from the alto and/or bass musical instrument is also input to the distortion applying means. Rather, an increased gain in the central region of the S-shape response allows tone components from the alto and/or bass musical instrument to be boosted, providing an additional effect that the vocal or the musical tone from the tenor saxophone can be musically accentuated.

Denoting the resistances of resistor elements 61 and 62 by R1 and R2 and the capacitances of capacitors 63 and 64 contained in the high pass filter 32 by C1 and C2, the high pass filter 32 has a cut-off frequency which is defined by $Fch=1/(2\pi\sqrt{R1\cdot R2\cdot C1\cdot C2})$. Accordingly, the cut-off frequency Fch can be changed to a desired value by choosing these constants R1, R2, C1 and C2. In a similar manner, denoting the resistances of resistor elements 65 and 66 in the low pass filter 33*a* of the low pass filter 33 by R3 and R4 and the capacitances of capacitors 67 and 68 by C3 and C4, the cut-off frequency is defined by $1/(2\pi\sqrt{R1\cdot R2\cdot C1\cdot C2})$.

Accordingly, the cut-off frequency can be changed to a desired value by choosing these constants R3, R4, C3 and C4 and by similarly choosing the constants of corresponding elements in the filter 33*b*. It is also possible to allow a user to set up the cut-off frequency of the high pass filter 32 and the cut-off frequency of the low pass filter 33 by providing an arrangement in which the resistances of resistor elements in the filters 32 and 33 can be changed as required.

The cut-off frequency and/or the cut-off response of the low pass filter 37 may be chosen to be adjustable so that they may be adjusted to the preference of a user. The low pass filter 37 may be omitted by choosing the non-linear response of the distortion applying means 34 so that the suppression response for the higher pitch components and/or the cut-off frequency may be chosen depending on the non-linear response or in accordance with the occurrence of harmonics (overtones) so that the distortion applying means 34 may produce desired harmonics (overtones) at desired levels. To provide such distortion applying means 34, desired non-linear responses may be entered in storage means which store output values in relation to an address corresponding to an input value, for example, and the storage means may be read in terms of the address which is defined by the level of the input audio signal.

Figure 13:
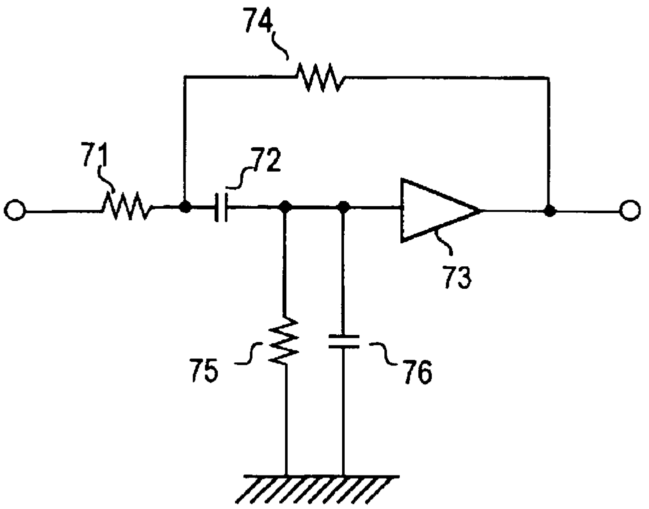
FIG. 13 is a circuit diagram showing an example in which filter means 31 is formed with a bandpass filter.
Figure 14:
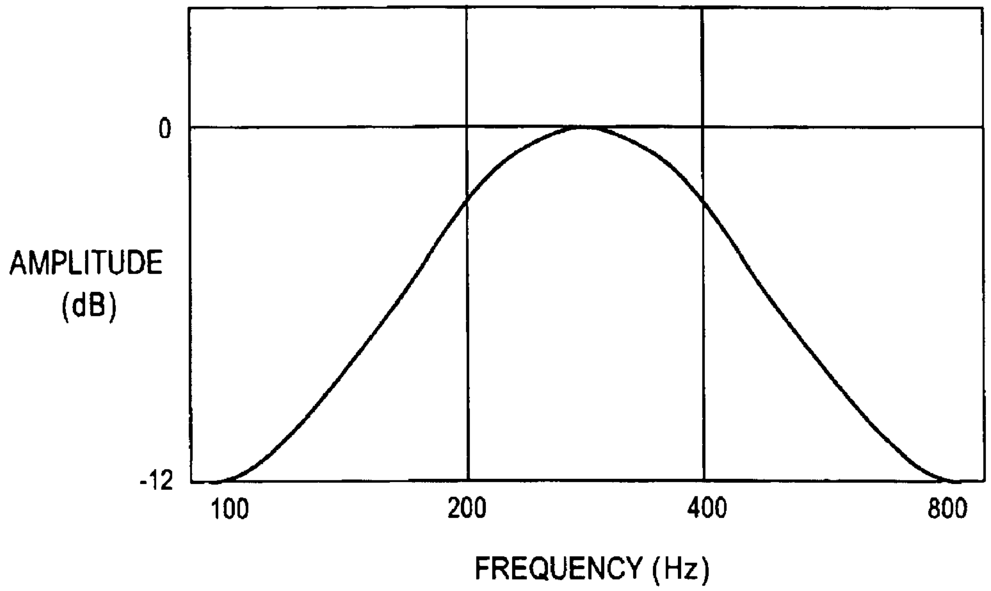
FIG. 14 diagrammatically illustrates an exemplary amplitude-frequency response of the bandpass filter shown in FIG. 13.

In the above description, the filter means 31 comprises the high pass filter 32 and the low pass filter 33, but may comprise a single bandpass filter. An example of such bandpass filter is shown in FIG. 13. Specifically, an input terminal is connected to an input terminal of an operational amplifier 73 through a series circuit of resistor 71-capacitor 72, and a resistor 74 is connected between a junction between the resistor 71 and the capacitor 72 and the output terminal of the operational amplifier 73, and the input terminal of the operational amplifier 73 is connected to the ground through a parallel circuit of a resistor 75 and a capacitor 76. In this instance, the amplitude-frequency response may be such that the cut-off frequency on the bass side is 200 Hz and the cut-off frequency on the higher pitch side is 400 Hz while the cut-off response on the bass side is equal to +12 dB/Oct and the cut-off response on the higher pitch side is equal to −12 dB/OCT, as shown in FIG. 14. Preferred values for the both cut-off frequencies are determined in the similar manner as the cut-off frequency of the high pass filter 32 and the cut-off frequency of the low pass filter 33 have been chosen.

Figure 15:
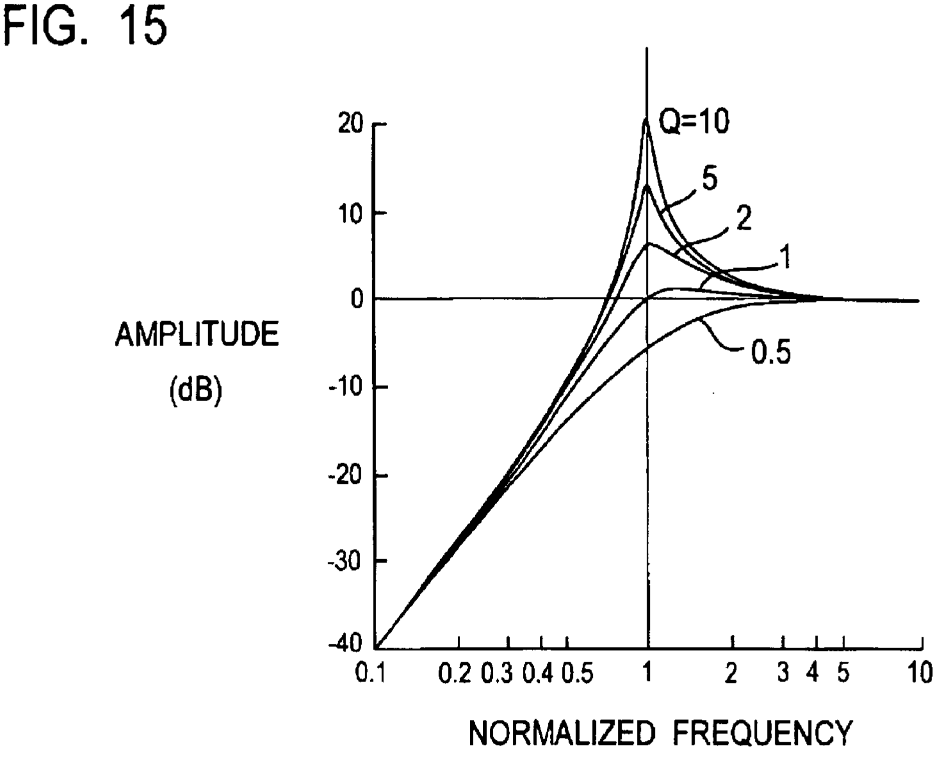
FIG. 15 diagrammatically illustrates an exemplary response of a high pass filter 32 having a shoulder peak in its cut-off response.

The amplitude-frequency of the high pass filter 32 may have a shoulder portion in its cut-off response raised in order to boost a corresponding region. For example, considering the amplitude-frequency response shown in FIG. 15, denoting the frequency at which a peak on the shoulder of the cut-off response occurs by $f_0$ and the bandwidth $\Delta F$ where the amplitude is by 3 dB lower than the peak value, divided by $f_0$, by Q, it is possible to increase Q value to provide a sharp peak on the shoulder as shown in FIG. 15, to provide a gentle slope or to prevent a peak from occurring. The abscissa in FIG. 15 represents a normalized frequency axis in which the frequency $f_0$ where the peak occurs is defined as 1. For the high pass filter 32 shown in FIG. 7, Q is defined as follows:

$$Q = \frac{1}{\sqrt{\frac{R1}{R2}\cdot\frac{C1}{C2}} + \sqrt{\frac{R1}{R2}\cdot\frac{C2}{C1}}}$$

Accordingly, assuming that C1=C2 and R1=R2, for example, it follows that Q=0.5. Assuming that C1=C2, the greater R2 is chosen relative to R1, the greater Q. In this manner, the shoulder on the cut-off response can be raised as desired. By boosting a component or components adjacent to the lowest frequency among the components corresponding to double overtone regions which are picked out in this manner, the bass tone boosting effect can be enhanced. Alternatively, the timbre can be adjusted by changing Q. In this respect, it is desirable that the resistance R1 and/or R2 can be adjusted by a user.

Similarly, a peak may be formed on the shoulder of the cut-off response of the low pass filter 33, thus providing a steep cut-off response. In the example shown in FIG. 7, Q of the low pass filter 33*a* is defined as follows:

$$Q = \frac{1}{\sqrt{\frac{R4}{R3}\cdot\frac{C4}{C3}} + \sqrt{\frac{R3}{R4}\cdot\frac{C4}{C3}}}$$

Accordingly, when a choice is made such that R3=R4, the greater C3 is chosen relative to C4, the greater Q, thus allowing the cut-off response to be made steep.

Figure 1:
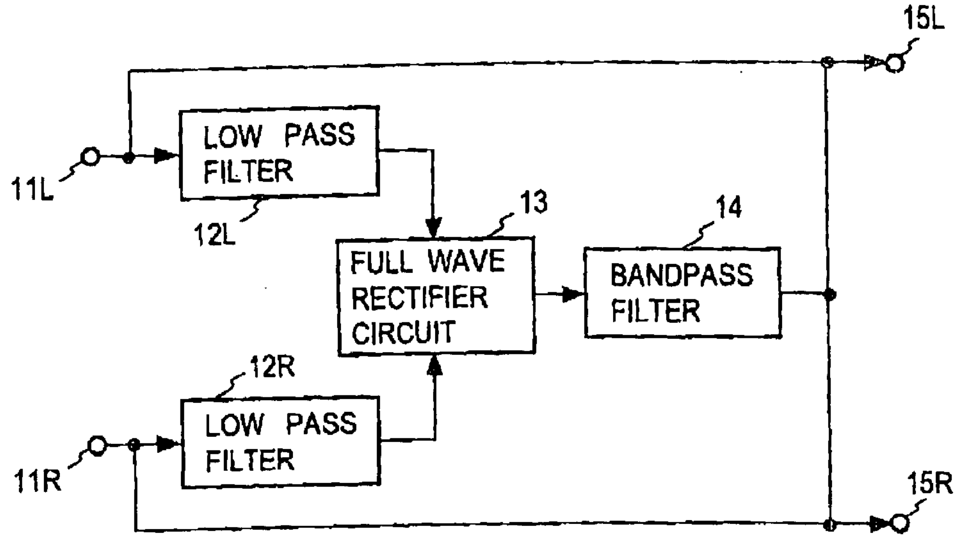
FIG. 1 is a block diagram showing one example of a conventional bass boosting circuit.
Figure 2:
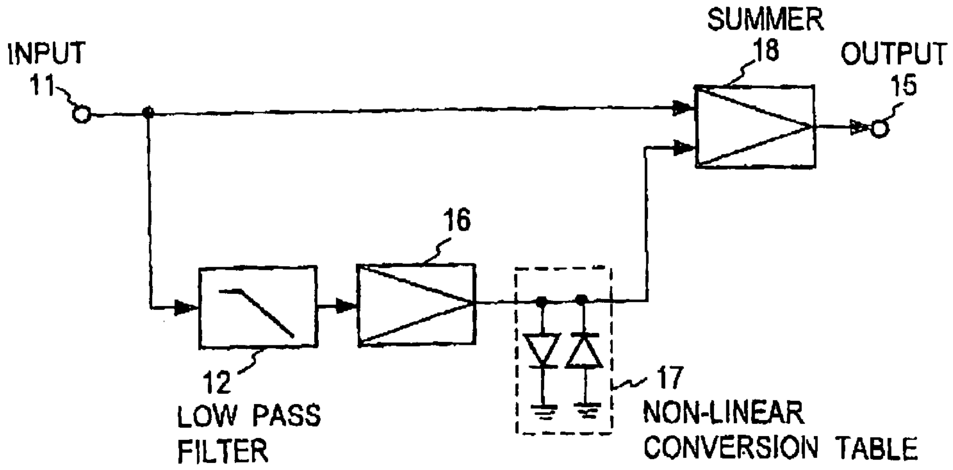
PRIOR ART FIG. 2
FIG. 2 is a block diagram showing another example of a conventional bass boosting circuit.
Figure 3:
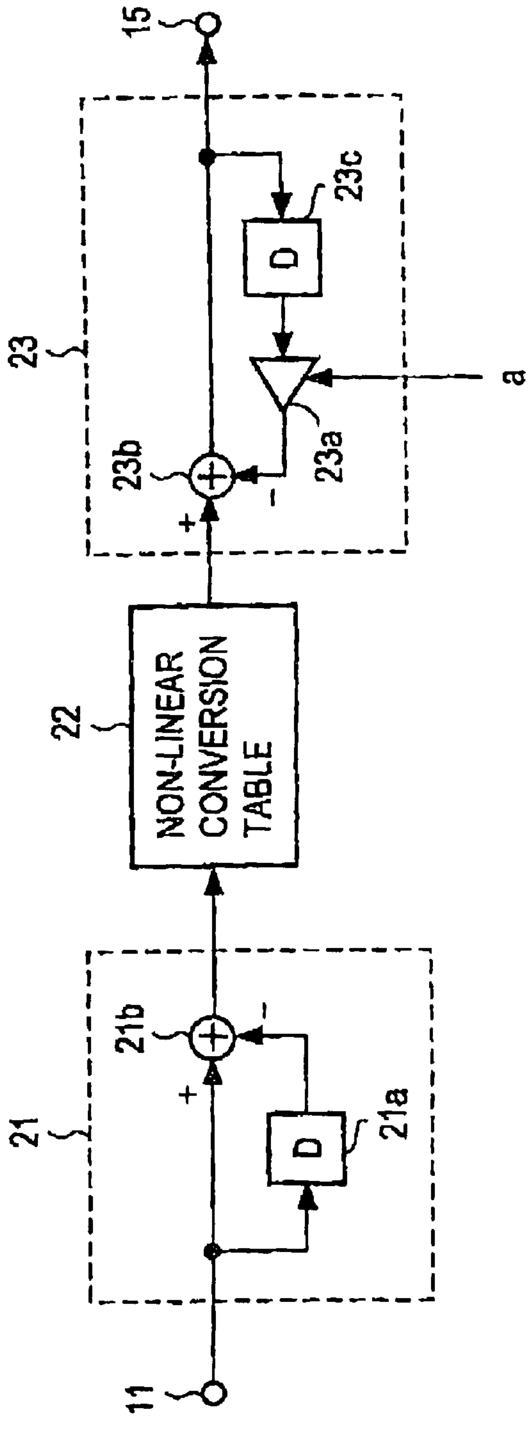
FIG. 3 is a block diagram showing a musical tone processor of a sound source unit of a conventional electronic musical instrument.
Figure 4A:
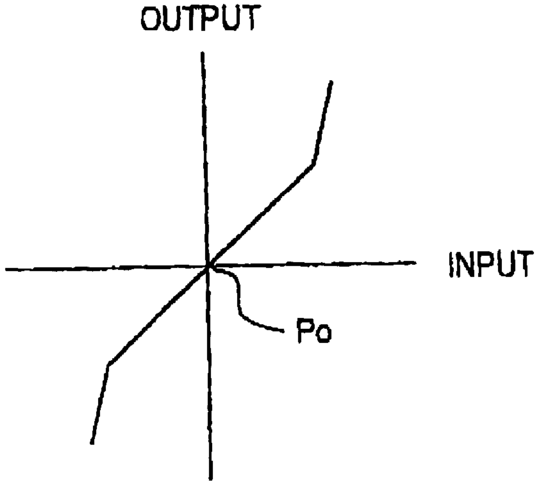
FIG. 4 diagrammatically illustrates several examples of a conversion response of a non-linear conversion table 22 shown in FIG. 3.
Figure 4B:
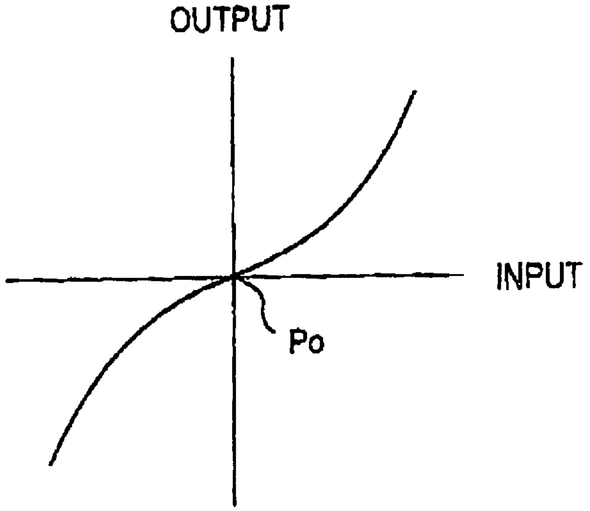
PRIOR ART FIG. 4B

Distortion applying means 34 may comprise a clipper circuit formed by an anti-parallel connection of silicon diodes as shown in FIG. 2, a light emitting diode which exhibits a non-linear voltage-current response, or a circuit which uses a plurality of diodes or other semiconductor elements as switching elements to provide a non-linear response by a piecewise line approximation. To effect the application of the distortion using a digital technology, non-linear responses may be stored in storage means to be subsequently read therefrom as mentioned previously, or a function which exhibits a non-linear response such as a polynomial or a power function may be used to apply a distortion. Also, the high pass filter 32 and the low pass filter 33 shown in FIGS. 5 and 7 may be connected in a reversed sequence from the illustration.

Figure 16:
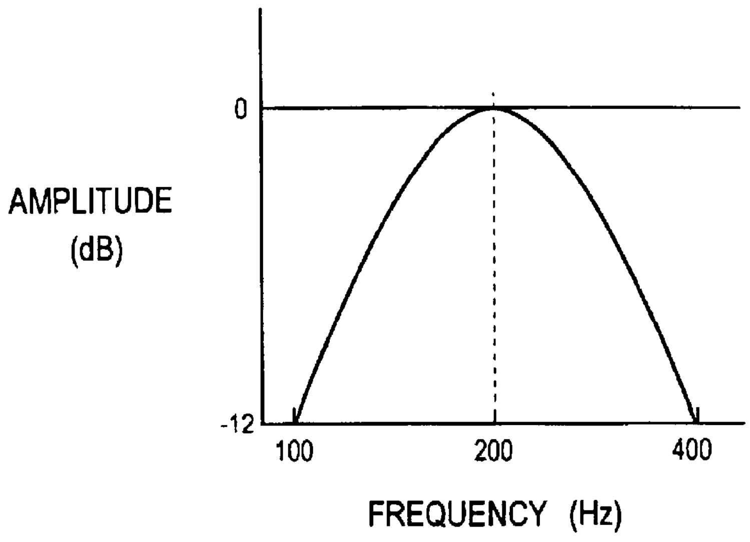
FIG. 16 diagrammatically illustrates an exemplary response of a narrow-bandpass filter acting as filter means 31 to pick out a double overtone component of a desired bass tone.

In the above description, the filter means 31 is used to pick out components corresponding to double overtone regions from a bass musical instrument. However, it is also possible to pick out principally only components corresponding to double overtones of a musical instrument such as a base, for example, for which the bass tones are to be boosted. When principally picking out only components corresponding to the double overtones of the bass, the filter means 31 may comprise a bandpass filter shown in FIG. 13, which may be a narrow-bandpass filter having a cut-off frequency on the bass side and a cut-off frequency on the higher pitch side which coincide with each other. An example of the resulting amplitude-frequency response is shown in FIG. 16. In this Figure, the pass frequency is 200 Hz, and a response is such that a peak is located at the location of 200 Hz with an attenuation on both the bass side and the higher pitch side which is equal to 12 dB/OCT.

As mentioned previously, the filter means 31 may comprise the high pass filter 32 alone. However, in this instance, the distortion applying means 34 should be one having an input-output response which is non-linear and which has no point symmetry with respect to the center of the amplitude of an input signal, for example, a response such as shown in FIG. 6, thus allowing an increased number of components corresponding to even-numbered overtones to be produced to enable tones to be produced which are brilliant and clearly accentuated.

In either instance, the low pass filter 37 may not be used, but when it is used, the choice of the amplitude-frequency response should be made in the similar manner as mentioned above.

In the above description, various parts have been principally constructed with analog circuits, but may be constructed with digital circuits. In this instance, where a digital output signal from a CD player, or a digital signal which is decoded from a musical data transmitted by electronic distribution is used an audio signal to be input as a digital signal, the various parts shown in FIG. 5 may be constructed by digital circuits, and the digital audio signal may be input to the input terminal 11. Where an analog audio is input, the audio signal input to the input terminal 11 may be converted into a digital signal in an analog-digital converter 81 as indicated in broken lines in FIG. 5 before feeding it to the filter means 31 and the summer 18. Also, a digital output signal from the summer 18 is converted into an analog signal in a digital-analog converter 82 to be delivered to the output terminal 15.

Figure 17:
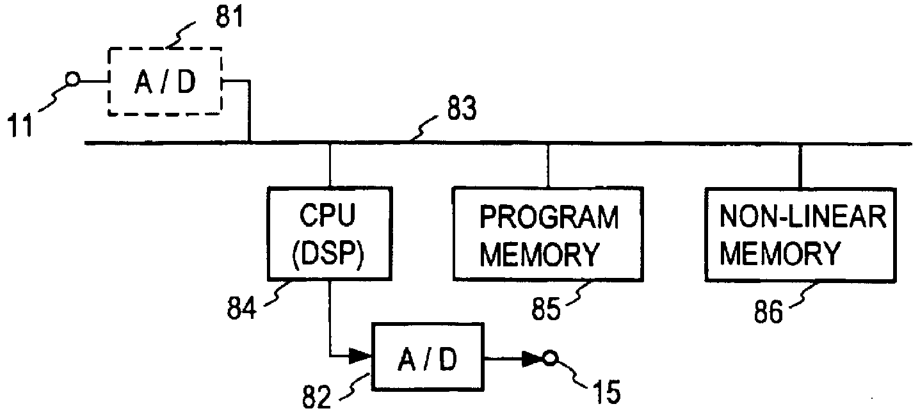
FIG. 17 is a block diagram showing an exemplary arrangement in which the present invention is embodied by the execution of a program by CPU or DSP.
Figure 18:
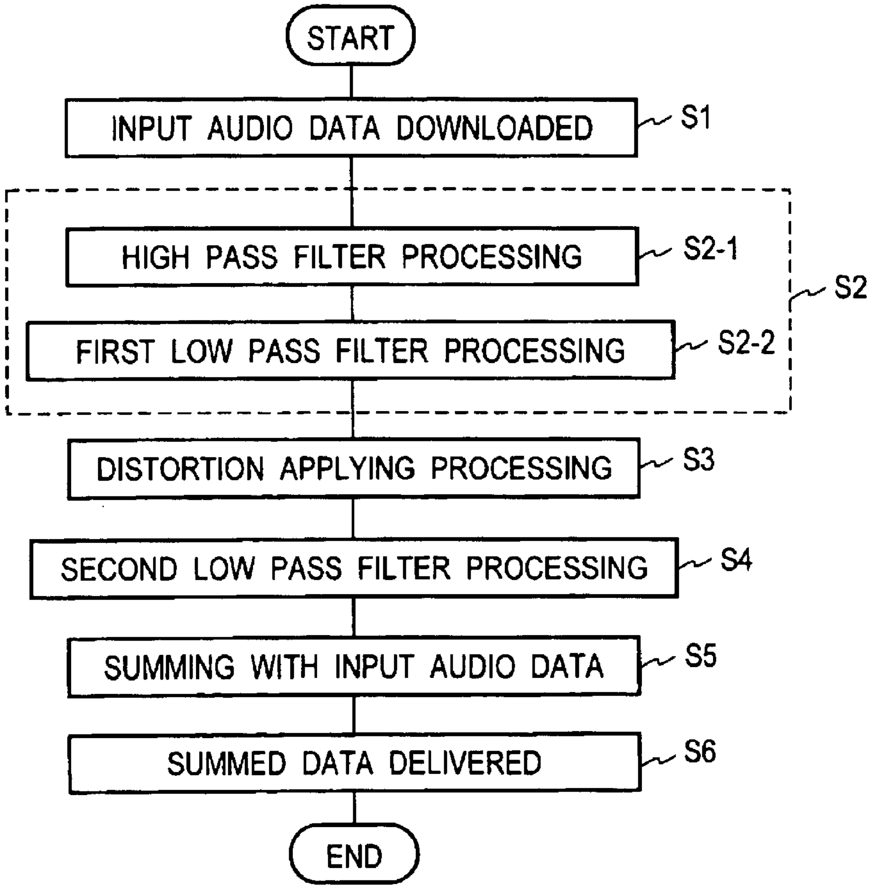
FIG. 18 is a flow chart of an exemplary procedure of the method according to the present invention.

The present invention can be implemented by using a software processing. By way of example, as shown in FIG. 17, a CPU or DSP (digital signal processor) 84; a program memory 85 and a non-linear memory 86 are connected to a bus 83, and where an audio signal from an input terminal 11 is an analog signal, it is converted into digital data in an A/D converter 81. Alternatively, digital data which is decoded from musical data that is transmitted by electronic distribution is directly downloaded into CPU 84 through the bus 83. CPU 84 reads, decodes and executes the program which is stored in the program memory 85. The decoding and execution of the program performs a processing operation as shown in FIG. 18, for example. Specifically, the input audio data is initially downloaded (S1), a filter processing is applied to the downloaded audio data to pick out component data corresponding to double overtone regions of a bass musical instrument (S2), the pick-out operation being performed by applying a bandpass filter operation which is similar to that shown in FIG. 14 to the input audio data or by applying a high pass filter processing which is similar to that of the high pass filter 32 as shown in FIG. 5 to the input audio data (S2-1), and subsequently a first low pass filter processing similar to that of the low pass filter 33 is applied (S2-2). Either one of the high pass filter processing (S2-1) and the low pass filter processing (S2-2) may precede the other.

Subsequently, a distortion applying operation (S-3) takes place with respect to component data corresponding to double overtone regions which are picked out by the filter processing mentioned above. By way of example, the non-linear memory 86 shown in FIG. 17 stores non-linear input-output responses such as is shown in FIG. 6, for example. The non-linear memory 86 is read out in accordance with the component data corresponding to the double overtone region which is picked out to apply a non-linear distortion to the component data corresponding to this double overtone region. Alternatively, a calculation of a non-linear function is made in the CPU 84 using the component data corresponding to the double overtone region as a variable to apply a non-linear distortion to the component data corresponding to the double overtone region. If required, a second low pass filter processing similar to that of the low pass filter 37 shown in FIG. 5 may be applied to the component data corresponding to the double overtone region to which the non-linear distortion is applied (S4), and the processed data may be added with the input audio data (S-5) and fed to the D/A converter 82 shown in FIG. 17 (S-6). D/A converter 82 converts the input data into an analog signal and delivers it to the output terminal 15.

By way of example, the processing program shown in FIG. 18 may be installed in a memory within a personal computer, non-linear input-output response data may be stored; musical data may be received by electronic distribution and decoded; and CPU in the personal computer may be caused to execute the loaded program with respect to the decoded digital data. Thus, CPU 84, the program memory 85 and the non-linear memory 86 shown in FIG. 17 may be disposed within the personal computer.

As described above, in accordance with the invention, the occurrence of acoustic abnormalities of bass tones having an increased loudness which results from a cross modulation between the fundamental tone components of a plurality of the bass musical instruments is avoided, the likelihood that the alto and/or higher pitch region may be excessively boosted to a stronger degree than the bass due to the overtones which are based on the bass tones is avoided, the loss of a time concurrency between the bass components and the higher pitch components is avoided, and the likelihood for the occurrence of acoustic abnormalities due to a cross modulation between musical tones from higher pitch musical instruments is avoided.

Distortion applying means allows even-numbered overtones to be produced, allowing tones to be obtained which are clearly accentuated and brilliant.

What is claimed is:

1. An acoustic effect apparatus for boosting an output signal of a bass musical instrument comprising an input for receiving the output signal of the bass musical instrument;

bandpass filter means coupled to the input for selecting a frequency band of an audio output signal;

distortion applying means coupled to the bandpass filter means for applying a non-linear distortion to the selected frequency band signal;

adding means coupled to the input and the distorting applying means for deriving a sum of the input audio signal and the output signal from the distortion applying means; wherein said bandpass filter means has a low frequency cut-off frequency which is in a range of 50 to 300 Hz, and a high frequency cut-off frequency which is in a range of 200 to 450 Hz and passes only a double-numbered overtone component of the desired fundamental tone of the bass musical instrument and suppresses the signal frequencies lower than or equal to the fundamental tone as well as the signal frequencies above the double-numbered overtone thereby selecting components corresponding to the double-numbered overtone component;

said distortion applying mew having an S-shaped non-linear input-output response defined by a curve which has no point symmetry with respect to a reference point of an input and an output function and applies non-linear distortion to the components thus passed by the band-pass filter means to thereby generate harmonics of double-numbered overtone frequencies, thereby boosting the even-numbered overtone of the fundamental tone of the bass musical instrument.

2. An acoustic effect apparatus according to claim 1 in which the filter means has a cut-off frequency response on the bass side which has a frequency response to allow a fundamental tone component of the bass musical instrument to be delivered at a reduced level.

3. An acoustic effect apparatus according to claim 2 in which the cut-off frequency response on the bass side of the filter means is chosen to be on the order of +12 dB/OCT.

4. An acoustic effect apparatus according to claim 1 in which the filter means has a cut-off frequency response on the higher pitch side which is steeper than the cut-off response on the bass side.

5. An acoustic effect apparatus according to claim 4 in which the cut-off frequency response on the higher pitch side of the filter means is on the order of −24 dB/OCT or steeper.

6. An acoustic effect apparatus according to claim 1 in which the filter means has a cut-off frequency on the bass side which is substantially equal to 200 Hz and a cut-off frequency on the higher pitch side which is substantially equal to 400 Hz.

7. An acoustic effect apparatus according to one of claims 1, 2, 3, 4, 5 or 6 in which the filter means comprises a high pass filter having a cut-off frequency which is equal to the cut-off frequency on the bass side, and a low pas filter having a cut-off frequency which is equal to the cut-off frequency on the higher pitch side.

8. An acoustic effect apparatus according to claim 7 in which the high pus filter frequency response has a small peak formed on a shoulder located adjacent to the cut-off frequency of its amplitude-frequency characteristic curve.

9. An acoustic effect device according to one of claims 1, 2, 3, 4, 5 or 6 in which the filter means comprises a bandpass filter.

10. An acoustic effect device according to one of claims 1, 2, 3, 4, 5 or 6, further comprising means for changing the cut-off frequency of the filter means.

11. An acoustic effect apparatus according to claim 1 in which the distortion applying means comprises a transistor having a collector, to which an output from the filter means is fed, and an emitter which deliver an output signal, and means for setting up a base current of the transistor, the distortion applying means utilizing a non-linear response occurring adjacent to the zero point of the collector current-collector-emitter voltage response of the transistor.

* * * * *